US010656307B2

(12) United States Patent
Schulz et al.

(10) Patent No.: US 10,656,307 B2
(45) Date of Patent: May 19, 2020

(54) OPTICAL ELEMENT

(71) Applicant: Fraunhofer-Gesellschaft zur Förderung der angewandten Forschung e.V., München (DE)

(72) Inventors: Ulrike Schulz, Jena (DE); Friedrich Rickelt, Jena (DE); Peter Munzert, Jena (DE); Norbert Kaiser, Jena (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/281,820

(22) Filed: Feb. 21, 2019

(65) Prior Publication Data
US 2019/0179056 A1 Jun. 13, 2019

Related U.S. Application Data

(62) Division of application No. 14/693,627, filed on Apr. 22, 2015, now Pat. No. 10,247,856.

(30) Foreign Application Priority Data

Apr. 28, 2014 (DE) .................... 10 2014 105 939

(51) Int. Cl.
*G02B 1/111* (2015.01)
*H01L 21/3065* (2006.01)
(Continued)

(52) U.S. Cl.
CPC ............. *G02B 1/111* (2013.01); *G02B 1/118* (2013.01); *G02B 1/12* (2013.01); *G02B 1/18* (2015.01);
(Continued)

(58) Field of Classification Search
CPC ........... G02B 1/111; G02B 1/18; G02B 1/118; G02B 1/12; H01L 21/3065; H01L 21/32136
See application file for complete search history.

(56) References Cited

U.S. PATENT DOCUMENTS 6,111,698 A 8/2000 Woodard et al.
7,914,158 B2 3/2011 Schulz et al.
(Continued)

FOREIGN PATENT DOCUMENTS

DE 10201492 A1 7/2003
DE 10241708 B4 9/2005
(Continued)

OTHER PUBLICATIONS

Askar, K., et al., "Self-assembled self-cleaning broadband anti-reflection coatings," Colloids and Surfaces A: Physiochemical and Engineering Aspects, vol. 439, Mar. 14, 2013, pp. 84-100.
(Continued)

*Primary Examiner* — Seahvosh Nikmanesh
(74) *Attorney, Agent, or Firm* — Slater Matsil, LLP

(57) ABSTRACT

An optical element is disclosed. In an embodiment an optical element includes a substrate having a silicone surface, an antireflection layer overlying the silicone surface, wherein the antireflection layer comprises a first organic layer having a reflection-reducing nanostructure, the nanostructure having a depth of at least 30 nm, and a cover layer overlying the first organic layer, the cover layer having a thickness of no more than 40 nm.

8 Claims, 5 Drawing Sheets

(51) Int. Cl.
*H01J 37/32* (2006.01)
*H01L 21/3213* (2006.01)
*G02B 1/18* (2015.01)
*G02B 1/118* (2015.01)
*G02B 1/12* (2006.01)

(52) U.S. Cl.
CPC .... *H01J 37/32366* (2013.01); *H01L 21/3065* (2013.01); *H01L 21/32136* (2013.01)

(56) References Cited

U.S. PATENT DOCUMENTS

| | | | |
|---|---|---|---|
| 8,192,639 B2 | 6/2012 | Schulz et al. | |
| 9,039,906 B2 | 5/2015 | Schulz et al. | |
| 9,912,115 B2 * | 3/2018 | Reinert | H01L 33/58 |
| 2005/0130068 A1 | 6/2005 | Kondoh et al. | |
| 2005/0233083 A1 | 10/2005 | Schulz et al. | |
| 2009/0174862 A1 * | 7/2009 | Lacan | G02B 1/105 |
| | | | 351/159.73 |
| 2009/0176015 A1 | 7/2009 | Nakanishi et al. | |
| 2009/0261063 A1 | 10/2009 | Munzert et al. | |
| 2010/0033819 A1 | 2/2010 | Schulz et al. | |
| 2011/0051246 A1 | 3/2011 | Schulz et al. | |
| 2012/0013845 A1 | 1/2012 | Conte et al. | |
| 2012/0100346 A1 | 4/2012 | Tazawa et al. | |
| 2012/0260970 A1 * | 10/2012 | Wirth | F24S 23/10 |
| | | | 136/248 |
| 2013/0128362 A1 | 5/2013 | Song et al. | |
| 2013/0250425 A1 | 9/2013 | Pett et al. | |
| 2013/0258483 A1 | 10/2013 | Pett et al. | |
| 2014/0034117 A1 * | 2/2014 | Wiesenfarth | H01L 31/048 |
| | | | 136/255 |
| 2014/0038109 A1 | 2/2014 | Rahman et al. | |
| 2014/0374377 A1 * | 12/2014 | Schulz | G02B 1/111 |
| | | | 216/24 |
| 2015/0309214 A1 | 10/2015 | Schulz et al. | |
| 2018/0277691 A1 * | 9/2018 | Karkkainen | G02B 1/111 |

FOREIGN PATENT DOCUMENTS

| | | |
|---|---|---|
| DE | 102007009512 A1 | 8/2008 |
| DE | 102008018866 A1 | 10/2009 |
| DE | 102014105939 A1 | 10/2015 |
| EP | 2083991 A1 | 9/2013 |
| JP | 2009276700 A | 11/2009 |
| JP | 2013231780 A | 11/2013 |
| JP | 2014502735 A | 2/2014 |
| JP | 2014507011 A | 3/2014 |
| WO | 2012078452 A1 | 6/2012 |
| WO | 2012087663 A1 | 6/2012 |
| WO | 2012144954 A1 | 10/2012 |
| WO | 2014007401 A1 | 1/2014 |

OTHER PUBLICATIONS

Brunner, R., et al., "Antireflective "moth-eye" structures on tunable optical silicone membranes," Applied Optics, vol. 51, No. 19, Jul. 1, 2012, pp. 4370-4376.

Kaless, A., et al., "Self-organized antireflective nanostructures on PMMA by ion etching," Optical Fabrication, Testing and Metrology II, Proceedings of SPIE, vol. 5965, 9 pages.

Kaless, A., et al., "NANO-motheye antireflection pattern by plasma treatment of polymers," Elsevier, Surface & Coatings Technology, vol. 200, Mar. 5, 2005, pp. 58-61.

Senn, T., et al., "Integration of moth-eye structures into a poly(dimethylsiloxane) stamp for the replication of functionalized microlenses using UV-nanoimprint lithography," Journal of Vacuum Science & Technology B, vol. 29, Issue 6, Nov./Dec. 2011, pp. 061601-1-061601-5.

Toma, M., et al., "Fabrication of Broadband Antireflective Plasmonic Gold Nanocone Arrays on Flexible Polymer Films," American Chemical Society, Nano Letters, vol. 13, Nov. 6, 2013, pp. 6164-6169.

\* cited by examiner

OPTICAL ELEMENT

CROSS-REFERENCE TO RELATED APPLICATIONS

This is a divisional application of U.S. application Ser. No. 14/693,627, filed Apr. 22, 2015, which claims the priority of German patent application 10 2014 105 939.5, filed Apr. 28, 2014, each of which is incorporated herein by reference in their entirety.

TECHNICAL FIELD

The invention relates to a method for producing an antireflection layer on a silicone surface and to an optical element having a silicone surface and an antireflection layer applied thereon.

BACKGROUND

Silicones are synthetic poly(organo)siloxanes in which silicon atoms are linked via oxygen atoms (inorganic polymers). Silicones have already been used industrially for some decades. Only in recent years, however, have silicones gained increasing importance for optical uses. Primarily in automobile manufacture, in the field of LED lighting technology and for optics for solar applications, highly transparent materials which maintain their properties for a long time even at elevated temperature (>100° C.) are required. Silicones differ fundamentally from the class of thermoplastics and also from the class of inorganic glasses. As inorganic polymers, they form solid phases far above the glass transition point, while both thermoplastics and inorganic glasses are geometrically stable only below the glass transition temperature. This fact also leads to the very high thermal stability of silicones while maintaining the glass-clear optical impression.

Recently, there have been new types of highly transparent liquid silicones on the market, which inter alia can be processed by special injection-molding processes to form high-precision optical parts.

One central theme of optical applications is antireflection, since without antireflection several percent of the incident light is lost by reflection at any surface in the optical system. All silicones exhibit a certain elastic behavior and relatively high thermal expansion. Permanent bonding to rigid brittle layers, such as conventional optical interference layers made of oxides constitute, is therefore difficult to achieve. Brittle oxide layers fracture and form cracks as soon as the substrate deforms. Furthermore, low molecular weight compounds are often also released from silicone components. These make durable bonding of coatings more difficult. Furthermore, silicone surfaces are generally very nonpolar, and therefore cannot be wetted and coated without activation.

There are therefore no examples in which silicones have been coated in a vacuum with conventional interference layer systems for the purpose of antireflection.

German patent document DE 10241708 B4 (U.S. counterpart application publication US 2005/0233083) and European patent document EP 2083991 B1 (U.S. counterpart application publication US 2009/0261063) describe methods with which a nanostructure, by which the reflection of the plastic substrate is reduced, is produced on the surface of a plastic substrate by means of a plasma etching process. Such a plasma etching process, however, is not suitable for the etching of silicone surfaces.

SUMMARY

Embodiments of the invention provide a method with which a thermally stable antireflection layer, which leads to antireflection in a large range of wavelengths and angles of incidence, can be produced on a silicone surface. An optical element having such an antireflection layer is furthermore provided.

According to at least one embodiment, the method for producing an antireflection layer on a silicone surface comprises the application of an organic layer and the production of a reflection-reducing nanostructure in the organic layer by a plasma etching process. In the method, the reflection-reducing nanostructure is advantageously produced not in the silicone surface but in an organic layer applied thereon.

The organic layer advantageously comprises an organic material which is distinguished by thermal stability up to a temperature of at least 150° C., preferably at least 200° C. Particularly preferably, the organic layer contains melamine (2,4,6-triamino-1,3,5-triazine), MBP (5,5'-di(4-biphenylyl)-2,2'-bithiophene), TPD (N,N'-bis(3-methylphenyl)-N,N'-diphenyl-benzidine), NPB (N,N-di(naphth-1-yl)-N,N'-diphenyl-benzidine), TPB (N,N,N',N'-tetraphenylbenzidine), TCTA (tris(4-carbazoyl-9-ylphenyl)amine), B2TP (5,5'-di-(4-byphenylyl)-2,2'-bithiophene), parylene.

The organic layer is preferably applied by a vacuum process, for example, by thermal evaporation. The organic layer preferably has a thickness of from 150 nm to 300 nm.

After the production of the nanostructure in the organic layer, a cover layer is advantageously applied in a further method step. The cover layer is preferably no more than 40 nm thick. Particularly advantageous is a thickness between 10 nm and 40 nm. In this range, the cover layer is on the one hand thick enough to ensure protection of the nanostructure, but on the other hand still thin enough not to impair, or to impair insubstantially, the reflection-reducing effect of the nanostructure.

The cover layer preferably contains a silicon oxide or an aluminum oxide. As an alternative, the cover layer may be formed from a plasma polymer which comprises siloxane monomers such as, for example, TMS (tetramethylsilane) or HMDSO (hexamethyldisiloxane).

It has been found that, by the application of an organic layer in which a nanostructure can be produced by a plasma etching process, and the subsequent application of a cover layer, a good antireflection effect can be achieved for a silicone surface over a large range of angles and wavelengths. Furthermore, the antireflection layer is distinguished by high thermal stability, so that the silicone surface provided with the antireflection layer can be used continuously at a temperature of more than 100° C. or even more than 150° C. The antireflection layer is therefore advantageous, in particular, for optical elements made of silicone which are intended to be used continuously at high operating temperatures.

In a preferred configuration of the method, the silicone surface is pretreated by ion bombardment before the application of the organic layer. Preferably, the pretreatment by ion bombardment is carried out with argon ions and/or oxygen ions, ion energies in the range of from 60 eV to 160 eV preferably being used. The treatment time is advantageously between 60 seconds and 600 seconds. By the pretreatment by means of ion bombardment, in particular the adhesion of the subsequently applied organic layer on the silicone surface is improved. As an alternative or in addition, in the method an adhesion layer may be applied onto the silicone surface. The adhesion layer preferably has a thickness of no more than 50 nm, particularly preferably between 5 nm and 15 nm. In a preferred configuration, the adhesion layer contains a silicon oxide, for example, $SiO_2$, SiO or $SiO_x$. The adhesion layer may, for example, be produced by thermal evaporation or by plasma polymerization from siloxane monomers.

The nanostructure produced in the organic layer preferably has a depth of at least 30 nm. In other words, the nanostructure extends from the surface of the organic layer at least 30 nm deep into the organic layer. The effect achieved by such a nanostructure is, in particular, that the nanostructured organic layer has a lower effective refractive index than a homogeneous layer of the material of the organic layer. In particular, the nanostructured organic layer has an effective refractive index which is lower than the refractive index of silicone.

In an advantageous configuration of the method, after the production of the nanostructure, a second organic layer is applied onto the nanostructure, a second nanostructure being produced in the second organic layer by means of a second plasma etching process.

In a preferred configuration of the method, an etch stop layer is applied onto the nanostructure before the application of the second organic layer. The etch stop layer advantageously prevents parts of the nanostructure from being removed when the second plasma etching process is carried out. The etch stop layer preferably has a thickness of no more than 30 nm. A small thickness of this type for the etch stop layer has the advantage that the effective refractive index in the interface region between the nanostructure and the second nanostructure is influenced only insubstantially. The etch stop layer may, for example, be an $SiO_2$ layer.

The second organic layer preferably has a higher etching rate in the second plasma etching process than the previously applied organic layer under the same process conditions. A nanostructure, by which an even lower effective refractive index is produced in the second organic layer than in the first organic layer, is advantageously produced in the second organic layer by the second plasma etching process. In this way, a particularly good antireflection effect is achieved on the silicone surface.

The cover layer applied after the production of the nanostructure, or optionally after the production of the second nanostructure, preferably has a thickness of no more than 40 nanometers. The cover layer may, in particular, have the function of a protective layer for the at least one nanostructured organic layer. Furthermore, the cover layer may advantageously be an antifog layer or a hydrophobic layer. For example, an at least 10 nm thick cover layer of $SiO_2$ imparts permanent antifog properties to the surface. A hydrophobic surface may, in particular, be achieved by the application of a polymer layer containing fluorine. In this configuration, the polymer layer containing fluorine is preferably between 5 nm and 10 nm thick. A hydrophobic surface has the advantage that water can roll off the surface easily.

The method is suitable, in particular, for providing an optical element made of a silicone with an antireflection layer. The optical element rendered antireflective by the method has a silicone surface and an antireflection layer applied onto the silicone surface, wherein the antireflection layer comprises an organic layer which comprises a nanostructure having a depth of at least 30 nm, and a cover layer, following on from the organic layer, which has a thickness of no more than 40 nm. Further advantageous configurations of the optical element may be found in the preceding description of the method, and vice versa.

The optical element is distinguished, in particular, in that the residual reflection is very low over a large range of wavelengths and angles, and the optical element can be used continuously at high temperatures of more than 100° C. or even more than 150° C. The silicone surface of the optical element may, in particular, be a curved surface or a microstructured surface without the reflection-reducing effect of the antireflection layer being substantially compromised.

BRIEF DESCRIPTION OF THE DRAWINGS

The invention will be explained in more detail below with the aid of exemplary embodiments in connection with FIGS. 1 to 4, in which.

Components which are the same or have the same effect are respectively provided with the same references in the figures. The components represented and the size proportions of the components with respect to one another are not to be regarded as true to scale.

DETAILED DESCRIPTION OF ILLUSTRATIVE EMBODIMENTS

In the method represented in FIGS. 1A to 1E according to one exemplary embodiment, a silicone surface 7 is provided with an antireflection layer. The silicone surface 7 is the surface of a substrate 10 which comprises or consists of a silicone. The silicone may, in particular, comprise siloxane units of the general formula $R_3Si—[O—SiR_2]n-O—SiR_3$, where R may be hydrogen atoms or alkyl groups. The silicone may, for example, be a molding silicone which is UV-curing, thermally curing or addition-crosslinking at room temperature. Examples of such silicones are poly(dimethylsiloxane) (PDMS) or the silicones available under the designations Wacker SilGel, Wacker SEMICOSIL, Bluesil 2-component molding compound, RTV 615 or Sylgard 184. Silicones which are intended for processing by injection molding are furthermore suitable. Such silicones are, for example, available under the following designations: Dow Corning MS1001, M1002, M1003, Wacker LUMISIL (for example, LUMISIL 419 UV, LUMISIL LR 7600).

The substrate 10 may, in particular, be an optical element which may, for example, be intended for use in lighting technology, solar technology, automobile technology or medical technology. Unlike in the exemplary embodiment represented, it is possible in particular for the optical element 10 to have a curved surface and/or a microstructured surface.

Figure 1A:
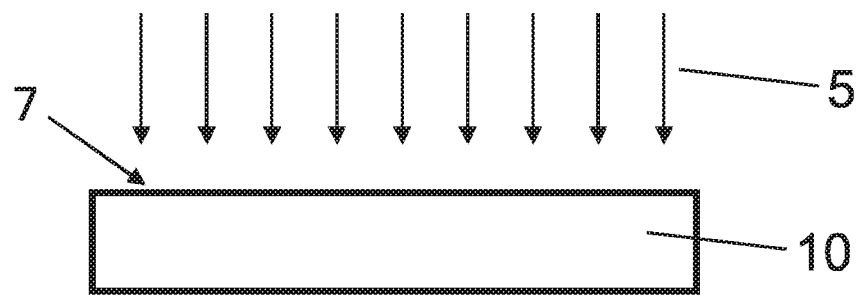
FIGS. 1A to 1E show a schematic representation of a method for producing an antireflection layer according to a first exemplary embodiment with the aid of intermediate steps.

As represented in FIG. 1A, in a first intermediate step a pretreatment of the silicone surface 7 is advantageously carried out by ion bombardment, which is indicated by the arrows 5. The ion bombardment is preferably carried out with argon ions and/or oxygen ions which have ion energies in a range of from 60 eV to 160 eV. The silicone surface 7 is preferably pretreated by ion bombardment during a treatment time of between 60 seconds and 600 seconds.

Figure 1B:

In a further intermediate step of the method, represented in FIG. 1B, an adhesion layer 6 is advantageously applied onto the silicone surface 7. The adhesion layer 6 is advantageously no more than 50 nm thick, preferably between 5 nm and 15 nm thick. A silicon oxide layer, for example, $SiO_2$, SiO or $SiO_x$, is advantageously used as the adhesion layer. The adhesion layer 6 may be thermally evaporated or alternatively, for example, produced by plasma polymerization from siloxane monomers, for example, TMS or HMDSO.

Figure 1C:
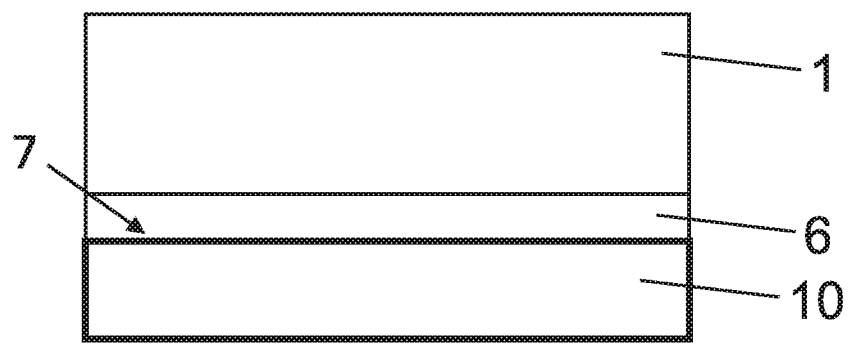

In a further intermediate step represented in FIG. 1C, an organic layer 1, which preferably has a thickness of between 150 nm and 300 nm, is applied onto the adhesion layer 6. The organic layer is advantageously formed from a thermally stable organic material. In particular, the organic layer 1 may comprise melamine (2,4,6-triamino-1,3,5-triazine), MBP (5,5'-di(4-biphenylyl)-2,2'-bithiophene), TPD (N,N'-bis(3-methylphenyl)-N,N'-diphenyl-benzidine), NPB (N,N-di(naphth-1-yl)-N,N'-diphenyl-benzidine), TPB (N,N,N',N'-tetraphenylbenzidine), TCTA (tris(4-carbazoyl-9-ylphenyl) amine), B2TP (5,5'-di-(4-byphenylyl)-2,2'-bithiophene), HMDSO (hexamethyldisiloxane) or parylene.

Figure 1D:
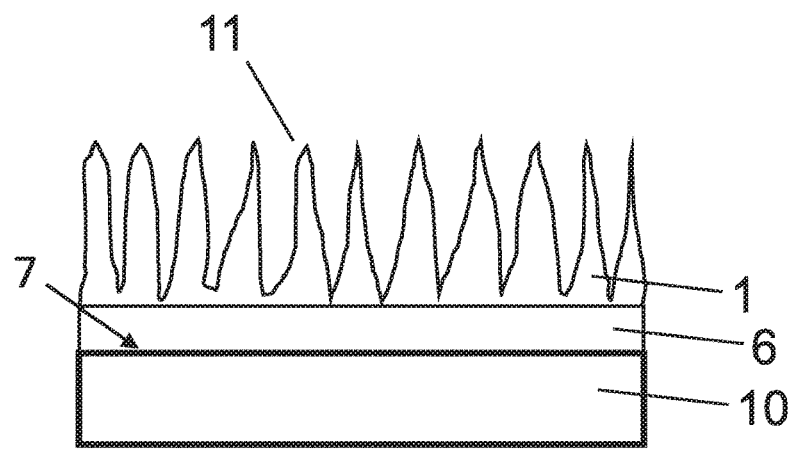

In the further intermediate step represented in FIG. 1D, a nanostructure 11 was produced in the organic layer 1 by means of a plasma etching process. During the plasma etching process, the organic layer 1 is, for example, bombarded with ions by means of a plasma ion source in order to produce the first nanostructure 11. Such a plasma etching process is known per se from the documents DE 10241708 B4 or EP 2083991 B1 cited in the introduction to the description, and will therefore not be explained in further detail.

The nanostructure 11 advantageously comprises a multiplicity of elevations and depressions, the depressions preferably extending into the organic layer to a depth of at least 30 nm, in particular from about 30 nm to 130 nm. Owing to the nanostructure 11, the effective refractive index in the organic layer 1 is advantageously lower than the refractive index of the organic layer 1 before the plasma etching process is carried out. In particular, the nanostructured organic layer 1 has an effective refractive index which is lower than the refractive index of silicone. The organic layer 1 provided with the nanostructure 11 may in particular have a refractive index gradient, the refractive index decreasing in a direction extending away from the silicone surface 7.

Figure 1E:
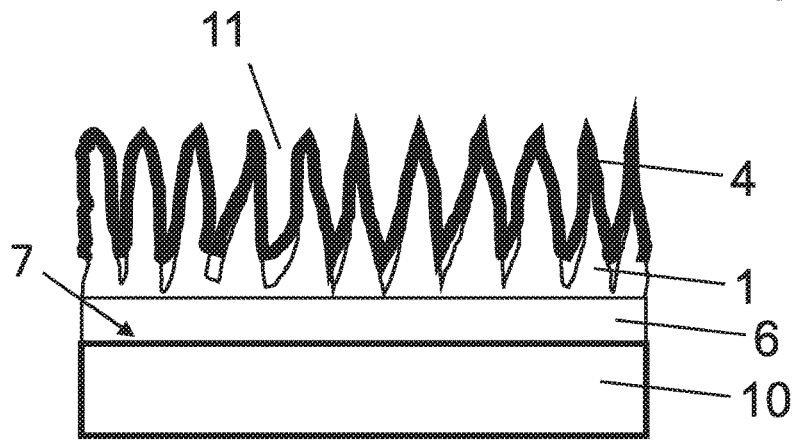

In a further method step, which is represented in FIG. 1E, a cover layer 4 is applied onto the nanostructure 11. The cover layer 4 may, in particular, function as a protective layer for the nanostructure 11. Furthermore, the cover layer 4 may advantageously also lead to other functionalities of the surface, and it may in particular function as an antifog layer or as a hydrophobic layer. The cover layer 4 is advantageously no more than 40 nm thick, preferably between 10 nm and 40 nm thick. Owing to the relatively small thickness, the cover layer 4 follows the nanostructure 11 of the organic layer 1 essentially conformally. In particular, the nanostructure 11 is not planarized by the cover layer 4. The cover layer 4 may comprise an inorganic layer, in particular an oxide layer, for example, $SiO_2$ or $Al_2O_3$. The cover layer 4 is preferably applied like the previously applied layers by a vacuum method, so that advantageously all of the antireflection layer can be produced by a vacuum process.

It is also conceivable for the cover layer 4 to be formed from a plurality of thin sublayers, the total thickness of the cover layer advantageously being no more than 40 nm. The cover layer may, for example, comprise an at least 10 nm thick $SiO_2$ layer, which imparts permanent antifog properties to the surface. Subsequently, for example, a polymer containing fluorine may be applied as a further sublayer of the cover layer, the polymer layer containing fluorine preferably having a thickness of between 5 nm and 10 nm. The polymer layer containing fluorine advantageously leads to hydrophobization of the surface, so that water can roll off the surface easily.

Figure 2:
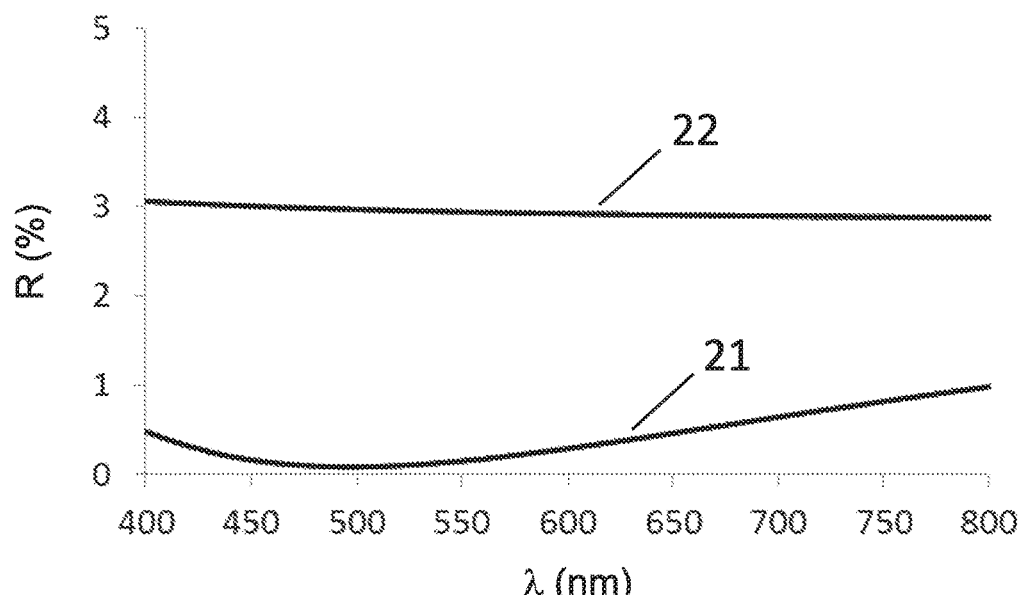
FIG. 2 shows the reflection R as a function of the wavelength λ of an optical element having an antireflection layer according to one exemplary embodiment in comparison with an uncoated silicone surface.

FIG. 2 represents the reflection as a function of the wavelength $\lambda$ in the visible spectral range for a film of a silicone which has been provided with an antireflection layer by a method according to FIGS. 1A to 1E (Curve 21). For comparison, the reflection of the uncoated silicone film (Curve 22) is furthermore represented. In order to produce the antireflection layer on the silicone film, in a first step a pretreatment by ion bombardment with argon ions and oxygen ions was carried out for 100 seconds with an ion energy of 1 eV and a bias voltage of 100 V in a vacuum evaporation deposition system of the type APS 904 (Leybold-Optics). Subsequently, a 10 nm thick $SiO_2$ layer was deposited as an adhesion layer. In a further step, a 150 nm thick layer of melamine was evaporation-deposited with a growth rate of 0.3 nm per second.

A plasma etching process was subsequently carried out by means of a plasma ion source, in order to produce a nanostructure in the organic layer of melamine. In order to produce the plasma, argon with a flow rate of 13 sccm and oxygen with a flow rate of 30 sccm were introduced into the vacuum system. The plasma ion source was operated with a bias voltage, which is a measure of the energy of the ions striking the surface, of 120 V with a discharge current of 50 A. The plasma etching process was carried out for 300 seconds, after which the thickness of the melamine layer is about 130 nm and the effective refractive index of the nanostructured melamine layer is about 1.1. A 20 nm thick layer of $SiO_2$ was deposited as a cover layer on the nanostructure by electron beam evaporation.

The average residual reflection in the wavelength range of from 400 nm to 800 nm is less than 0.5% for the silicone film provided with the antireflection layer under normal light incidence. The coated sample was stored for 1000 hours at a temperature of 105° C., without the optical properties being modified. This illustrates the high thermal stability of the antireflection layer.

FIGS. 3A to 3F represent a variant of the method for producing an antireflection layer.

Figure 3A:
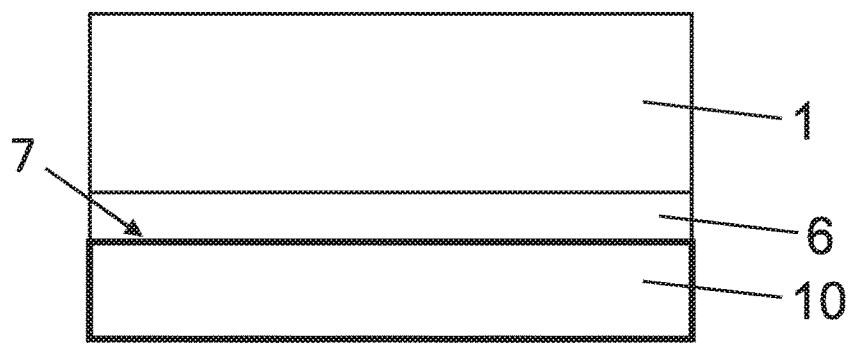
FIGS. 3A to 3F show a schematic representation of a method for producing an antireflection layer according to a further exemplary embodiment with the aid of intermediate steps.

As represented in FIG. 3A, in the method an adhesion layer 6 and an organic layer 1 are initially applied onto the silicone surface 7 of a substrate 10, which may in particular be an optical element. As in the first exemplary embodiment, a pretreatment of the silicone surface by ion bombardment may be carried out before the application of the adhesion layer 6.

Figure 3B:
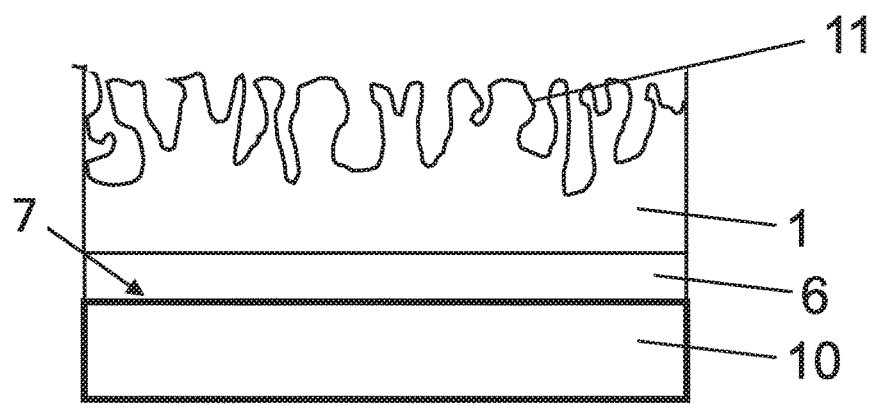

In the intermediate step represented in FIG. 3B, a nanostructure 11 was produced in the organic layer 1 by means of a plasma etching process.

Figure 3C:
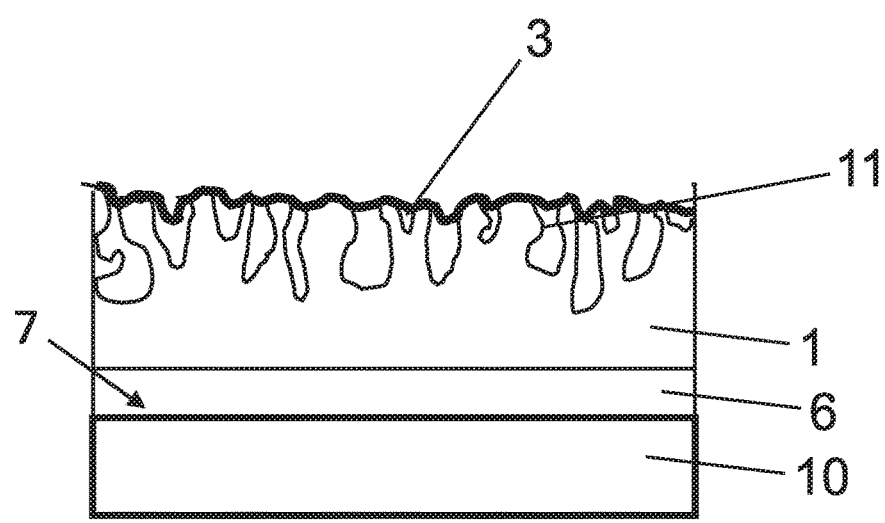

Unlike in the first exemplary embodiment, in a subsequent intermediate step represented in FIG. 3C, a cover layer is not applied directly onto the nanostructure 11, but instead an etch stop layer 3 which may in particular comprise a silicon oxide, for example, SiO$_2$, is initially applied. The etch stop layer 3 may, for example, have a thickness of about 15 nm.

Figure 3D:
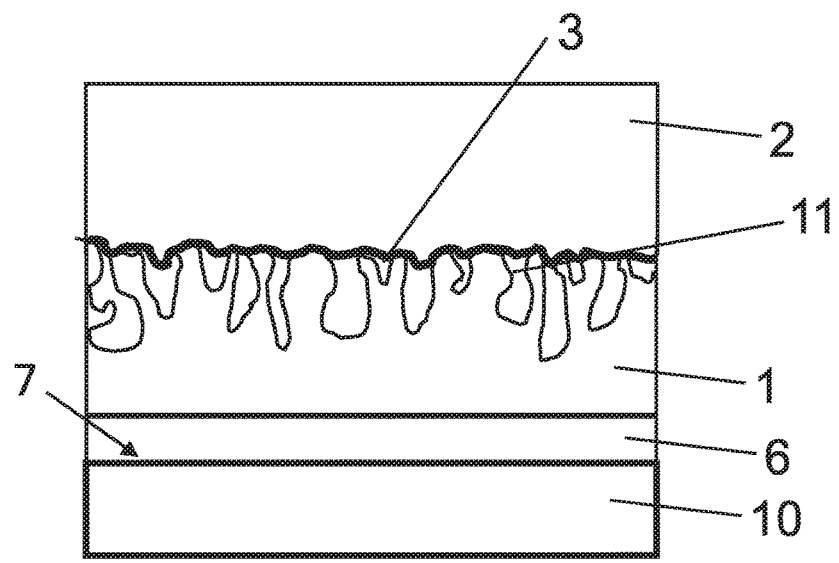

In a further method step represented in FIG. 3D, a second organic layer 2 is applied onto the first organic layer 1 provided with the nanostructure 11 and the etch stop layer 3.

Figure 3E:
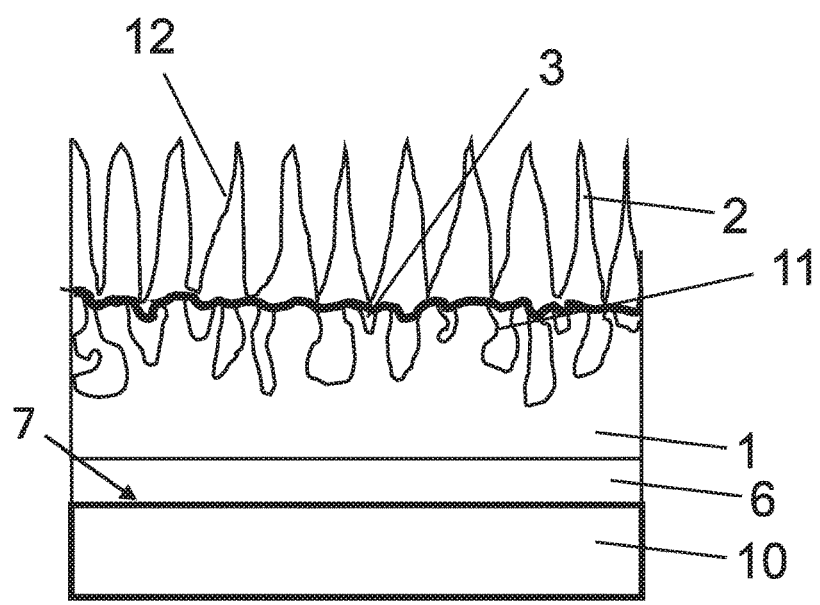

As represented in FIG. 3E, in a further method step a second nanostructure 12 is produced in the second organic layer 2 by means of a second plasma etching process.

Figure 3F:
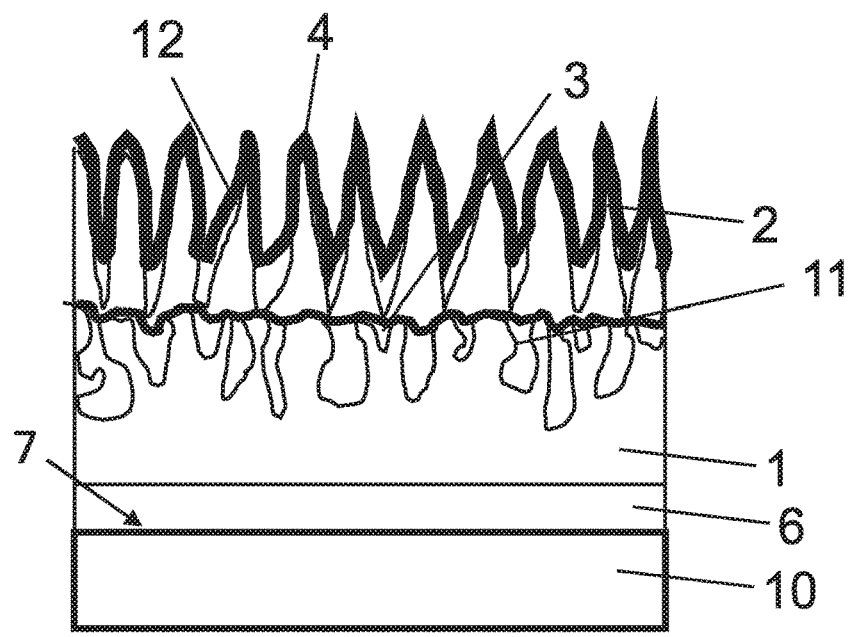

In the method step represented in FIG. 3F, a cover layer 4 was applied onto the second nanostructure 12, in which case the cover layer 4 may have the same configurations and advantageous properties as in the first exemplary embodiment.

The second exemplary embodiment therefore differs from the first exemplary embodiment in that the antireflection layer comprises two organic layers 1, 2 arranged above one another, which are respectively provided with nanostructures 11, 12 by a plasma etching process. In this way, a particularly good antireflection effect can be achieved. Advantageously, the organic material of the second organic layer 2 has a higher etching rate when the second plasma etching process is carried out than the material of the first organic layer 1 in the first plasma etching process. In this way, in particular, it is possible to produce in the second organic layer 2 a nanostructure 12 which has an even lower effective refractive index than the first organic layer 1 provided with the nanostructure 11. Both the first organic layer 1 and the second organic layer 2 may respectively have a refractive index gradient, the refractive index decreasing in a direction extending away from the silicone surface 7.

The second organic layer 2, like the first organic layer 1, is advantageously formed from a thermally stable organic material. In particular, the organic materials mentioned in connection with the first exemplary embodiment are suitable for this. As in the first exemplary embodiment, the cover layer 4 may in particular be used to protect the nanostructure 12 and/or it may have antifog properties or hydrophobic properties.

According to the method steps schematically represented in FIGS. 3A to 3F, by way of example an injection-molded optical element made of silicone, which has a refractive index n=1.42 at λ=500 nm, was provided with the antireflection layer. In this case, a plasma pretreatment was initially carried out in a vacuum evaporation deposition system of the type APS 904 (Leybold-Optics), the silicone surface being bombarded for 200 seconds with ions having an ion energy of at most 80 eV (set by a bias voltage of 80 V).

After the plasma pretreatment, an approximately 150 nm thick organic layer of MBP was applied by evaporation. The layer thickness was in this case measured by an oscillating quartz measuring system, with which the mass increase is detected. By means of a plasma ion source, a nanostructure was subsequently produced in the organic material MBP. Before the plasma etching process was carried out, in this exemplary embodiment a 2 nm thin layer of TiO$_2$ was initially deposited and the plasma etching process was subsequently carried out by means of an argon/oxygen plasma. The plasma etching process was operated with a bias voltage, which is a measure of the energy of the ions striking the surface, of 120 V and a discharge current of 50 A. In this way, a nanostructure with a depth of 80 nm and an effective refractive index of about 1.33 was achieved after an etching time of 350 seconds.

In a further step, an etch stop layer, namely a 15 nm thick SiO$_2$ layer, was evaporation-deposited. In a further step, in the same vacuum process, deposition of a second organic layer, namely a 250 nm thick melamine layer, was subsequently carried out by thermal evaporation with a growth rate of 0.3 nm/s. A second plasma etching process was subsequently carried out in order to produce a nanostructure in the second organic layer of melamine. This was done with a lower ion energy of 80 eV. Under these conditions, an etching rate of about 0.8 nm/s was achieved in the organic layer of melamine, while under these conditions only a thickness reduction of less than 0.1 nm/s would occur in the underlying MBP layer. After a plasma etching time of 150 s, the thickness of the melamine layer is still about 120 nm, the effective refractive index being about 1.1.

A cover layer, namely a 20 nm thick SiO$_2$ layer, was subsequently applied onto the second nanostructure.

Figure 4:
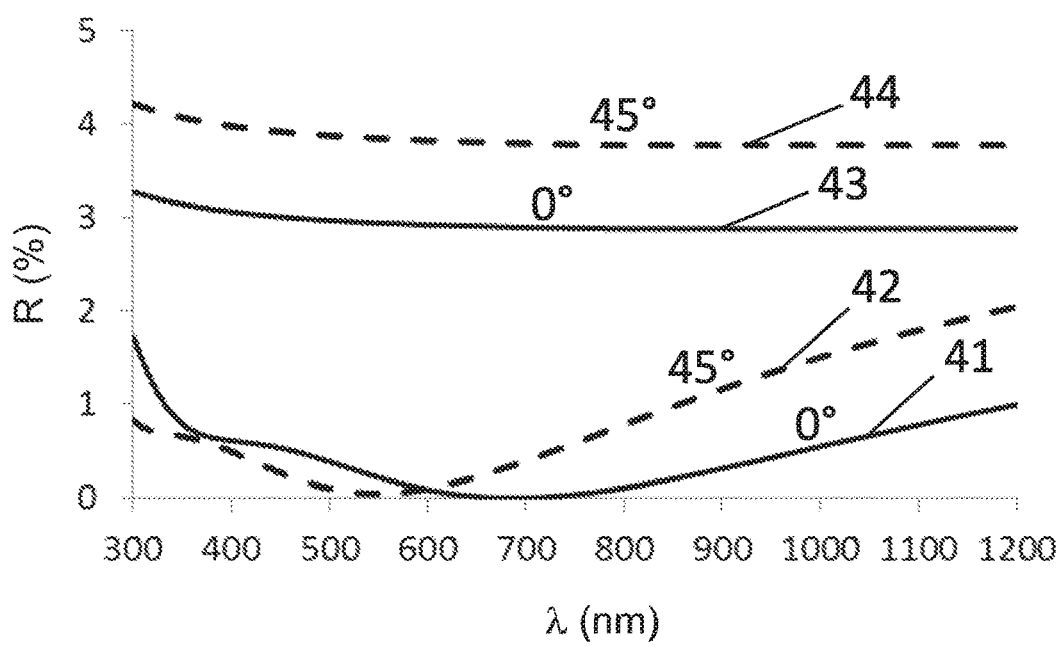
FIG. 4 shows the reflection R as a function of the wavelength λ for an optical element having an antireflection layer according to one exemplary embodiment in comparison with an uncoated silicone surface for angles of incidence of 0° and 45°.

FIG. 4 represents the reflection R of the silicone surface provided in this way with an antireflection layer in the wavelength range of from 300 nm to 1200 nm for an angle of incidence of 0° (Curve 41) and an angle of incidence of 45° (Curve 42). For comparison, the reflection R of the uncoated silicone surface for the angle of incidence 0° (Curve 43) and the angle of incidence 45° (Curve 44) are represented. The average residual reflection in the range of from 300 nm to 1200 nm for the silicone surface provided with the antireflection layer is only less than 0.5% for normal incidence and less than 1% for the light angle of incidence 45°.

The invention is not limited to the description with the aid of the exemplary embodiments. Rather, the invention covers any new feature and any combination of features, which includes in particular any combination of features in the patent claims, even if this feature or this combination is not explicitly indicated per se in the patent claims or exemplary embodiments.

What is claimed is:

1. An optical element comprising:
   a substrate having a silicone surface;
   an antireflection layer overlying the silicone surface, wherein the antireflection layer comprises a first organic layer having a reflection-reducing nanostructure, the nanostructure having a depth of at least 30 nm; and
   a cover layer overlying the first organic layer, the cover layer having a thickness of no more than 40 nm.

2. The optical element according to claim 1, further comprising an adhesion layer between the silicone surface and the first organic layer.

3. The optical element according to claim 2, wherein the adhesion layer comprises a silicon oxide.

4. The optical element according to claim 2, wherein the adhesion layer has a thickness of no more than 50 nm.

5. The optical element according to claim 1, wherein the first organic layer comprises a material selected from the group consisting of:
   melamine (2,4,6-triamino-1,3,5-triazine),
   MBP (5,5'-di(4-biphenylyl)-2,2'-bithiophene),
   TPD (N,N'-bis(3-methylphenyl)-N,N'-diphenyl-benzidine),
   NPB (N,N-di(naphth-1-yl)-N,N'-diphenyl-benzidine),
   TPB (N,N,N',N'-tetraphenylbenzidine),
   TCTA (tris(4-carbazoyl-9-ylphenyl)amine),
   B2TP (5,5'-di-(4-byphenylyl)-2,2'-bithiophene) and
   parylene.

6. The optical element according to claim 1, further comprising a second organic layer disposed between the first organic layer and the cover layer, wherein the second organic layer comprises a second nanostructure.

7. The optical element according to claim 6, wherein the second organic layer has a lower effective refractive index than the first organic layer.

8. The optical element according to claim 6, wherein the first organic layer and the second organic layer respectively have a refractive index gradient, the refractive index gradient decreasing in a direction extending away from the silicone surface.

\* \* \* \* \*